(12) United States Patent
Firth

(10) Patent No.: US 6,586,959 B1
(45) Date of Patent: Jul. 1, 2003

(54) METHOD AND APPARATUS FOR TESTING CIRCUITRY

(75) Inventor: Stephen Firth, Near Chepstow (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 136 days.

(21) Appl. No.: 09/917,244

(22) Filed: Jul. 27, 2001

(30) Foreign Application Priority Data

Aug. 4, 2000 (GB) ............................................ 0019279

(51) Int. Cl.$^7$ ................................................ G01R 31/26
(52) U.S. Cl. ........................................................ 324/765
(58) Field of Search .............................. 324/73.1, 617, 324/765, 158.1; 714/700, 724, 726, 738; 702/75, 85, 89

(56) References Cited

U.S. PATENT DOCUMENTS

| | | |
|---|---|---|
| 5,578,938 A | 11/1996 | Kazami |
| 5,633,879 A | 5/1997 | Potts et al. |
| 5,675,274 A | 10/1997 | Kobayashi et al. |
| 6,281,698 B1 * | 8/2001 | Sugimoto et al. ........... 324/765 |
| 6,347,287 B1 * | 2/2002 | Beckett et al. ................ 702/89 |
| 6,356,096 B2 * | 3/2002 | Takagi et al. ................ 324/765 |

OTHER PUBLICATIONS

Standard Search Report from application No. 105566 completed on Jan. 17, 2001.
British Search Report from corresponding United Kingdom patent application 0019279.9, filed Aug. 4, 2000.

* cited by examiner

*Primary Examiner*—Kamand Cuneo
*Assistant Examiner*—Minh N. Tang
(74) *Attorney, Agent, or Firm*—Wolf, Greenfield & Sacks, P.C.; James H. Morris

(57) ABSTRACT

A method of testing a circuit which includes the steps of applying at least one input reference signal to a circuit under test which provides a reference signal from at least one output of the circuit under test, and defining at least one output signal of the circuit with reference to the reference output signal, wherein the timing of the output reference signal is defined independently of the input reference signal.

17 Claims, 5 Drawing Sheets

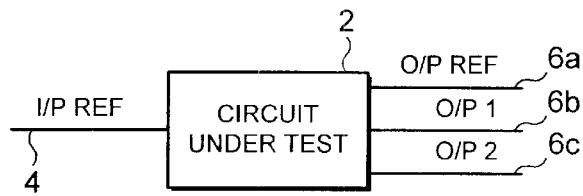
FIG. 1
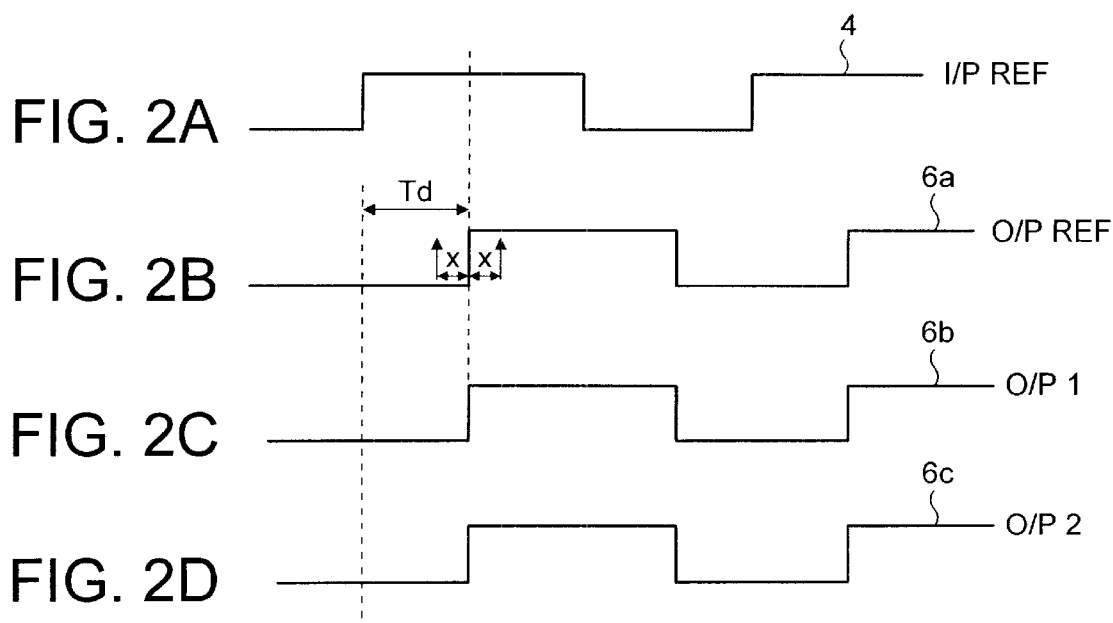
FIG. 2A
FIG. 2B
FIG. 2C
FIG. 2D

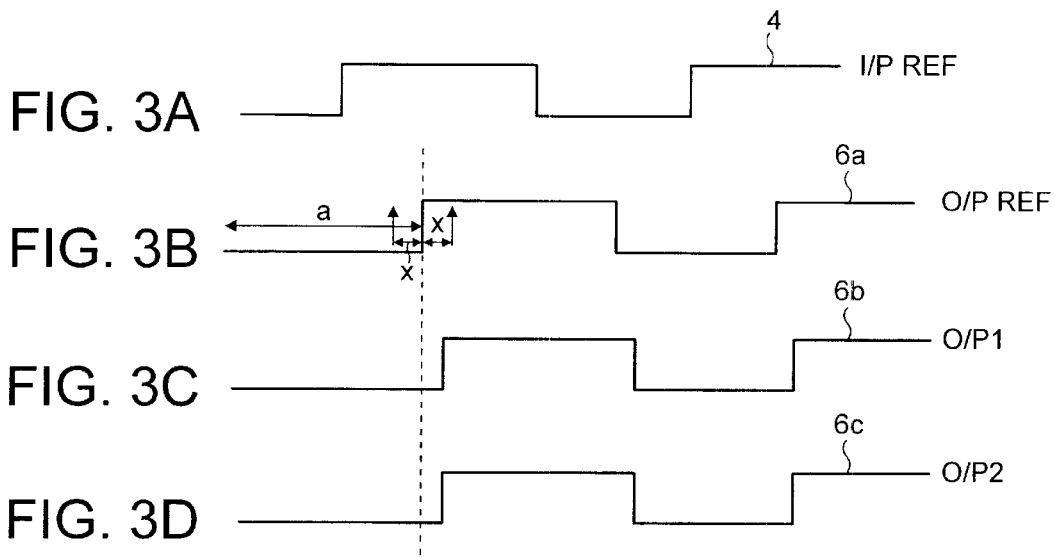
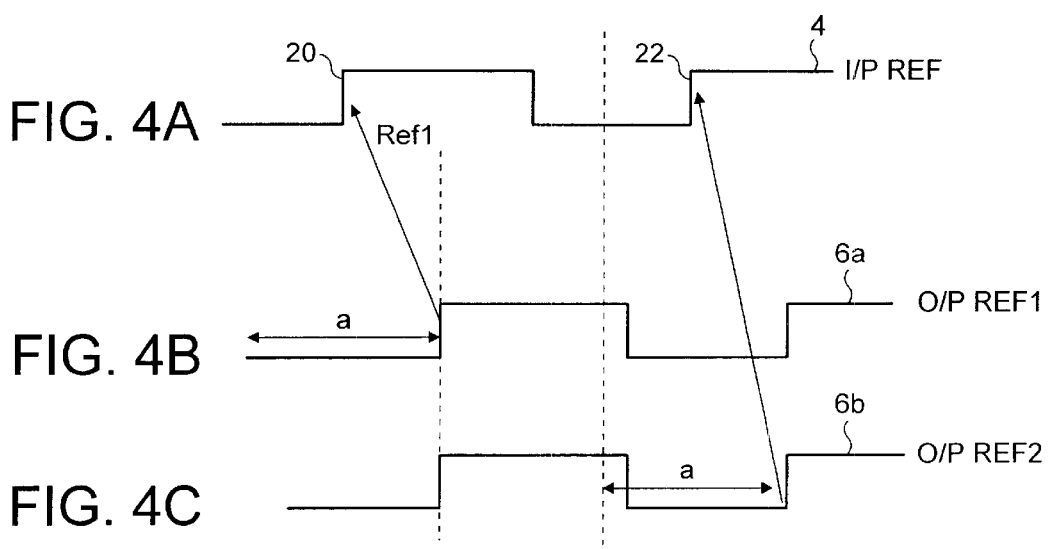

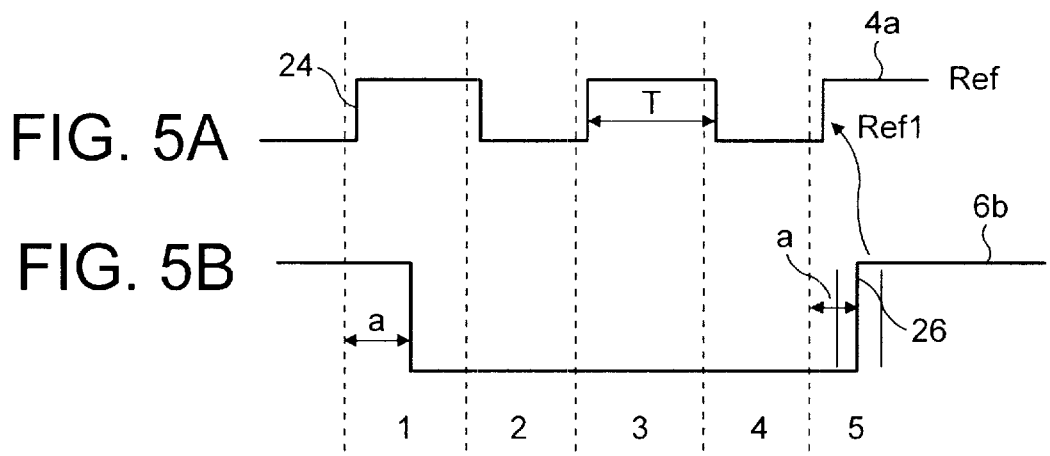
FIG. 5A
FIG. 5B
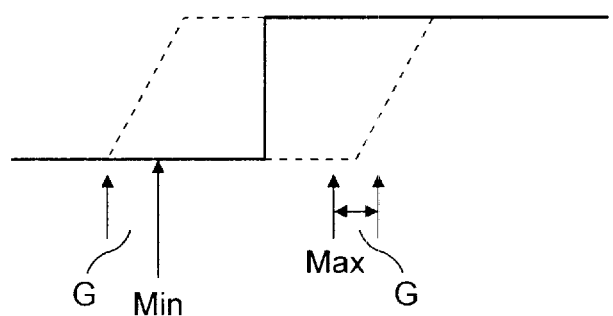
FIG. 6

METHOD AND APPARATUS FOR TESTING CIRCUITRY

BACKGROUND OF THE INVENTION

1. Field of the Invention

The present invention relates to a method of and apparatus for testing circuitry.

2. Discussion of the Related Art

When designing circuitry, it is necessary to test the circuitry before a design is finalised. For example, an integrated circuit may be tested. FIG. 1 shows the principals involved in testing. The circuit under test 2 has an input signal 4 applied thereto. The circuit under test should provide certain output signals 6 in response to the input signal. For illustrative purposes only, the circuit under test is shown with one input signal and three output signals. These inputs and outputs may represent input and output pins respectively.

The circuit under test 2 introduces a delay into the signals. The output reference signal 6a is the same as the input reference signal 4 and effectively provides a measure of the delay caused by the circuit under test 2. The delay introduced by the circuit under test 2 will vary from circuit to circuit. The other signals 6b and 6c output from the circuit under test 2 represent the response of parts of the circuit to the input reference signal 4.

Reference is made to FIGS. 2a–2d which shows the input reference signal 4 and each of the output signals 6a–6c. As can be seen from a comparison of FIGS. 2a and 2b, the circuit under test 2 introduces a delay of Td to signals that pass therethrough.

In the process of testing, a series of equations is determined. An equation is defined for each input and output pin. In practice, a series of equations would be written for each pin so as to define the behaviour of the pin over time. These signals are defined with respect to the input signal. For example, the output reference signal 6a might be defined by the following equations: Td−xns and Td+xns. In the example shown, at Td−x ns, the output reference signal should be 0 and at time Td+xns, the output signal should be 1. In a similar way, equations are defined for the two other output signals 6b and 6c. Any references above or hereinafter to ns denote nanoseconds.

In practice, once the equations had been written for every single pin, the delay Td, that is the difference between the reference in signal 4 and the reference out signal 6a was measured. All of the equations that included the value Td were then updated with the measured value of Td. As Td varies from circuit to circuit, each time a circuit is tested, Td would have to be updated. The updating involved in these equations is very expensive in terms of test time. This is because virtually every pin in every wave set needs to be updated. For example, in one integrated circuit that was tested, approximately 20,000 cells of the wave set memory were evaluated and updated for the AC parametrics for each supply voltage.

It is an aim of embodiments of the present invention to address this problem.

SUMMARY OF THE INVENTION

According to embodiments of the present invention there is provided a method of testing a circuit comprising the steps of applying at least one input reference signal to a circuit under test; providing a reference signal from at least one output of said circuit under test; and defining at least one output signal of said circuit with reference to said reference output signal, wherein the timing of said output reference signal is defined independently of said input reference signal.

BRIEF DESCRIPTION OF THE DRAWINGS

For a better understanding of the present invention and as to how the same may be carried into effect, reference will now be made by way of example to the accompanying drawings in which:

FIG. 1 illustrates the principal used in the testing of circuits;

FIGS. 2a–2d show the input and output signals of the circuit under test in a known testing arrangement;

FIGS. 3a–3d show the input and output of a circuit under test using a testing method embodying the present invention;

FIGS. 4a–4c show inputs and outputs of the circuit under test, in embodiments of the present invention, with two output references;

FIGS. 5a and 5b illustrate the principals of simple referencing of pulse widths used in embodiments of the present invention;

FIG. 6 illustrates the principals of guard periods used in embodiments of the present invention;

DETAILED DESCRIPTION

Figure 7:
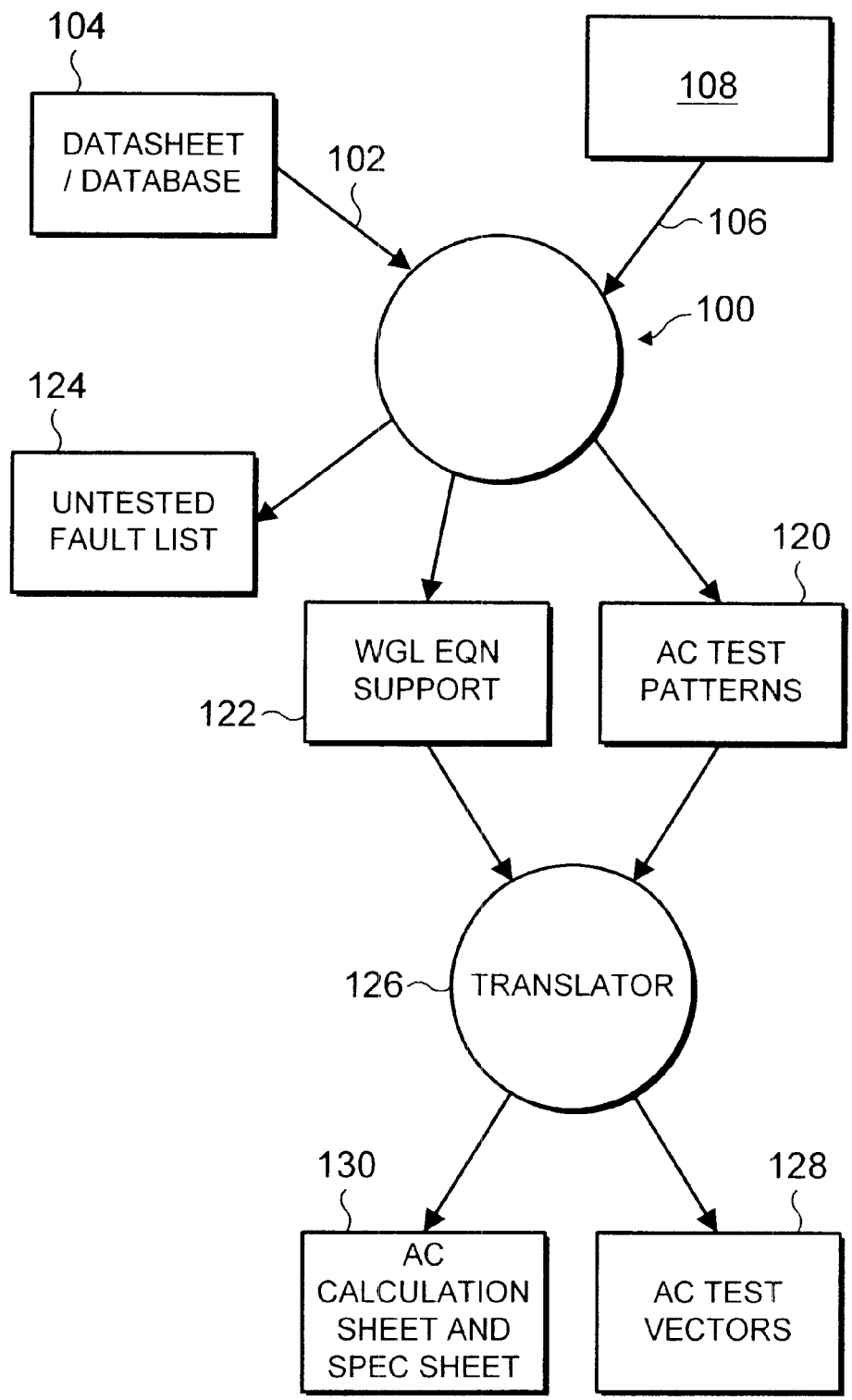
FIG. 7 illustrates the method of testing according to embodiments of the present invention.

Reference is made to FIGS. 1 and 3, which illustrate the principals of embodiments of the present invention. In embodiments of the present invention, an input reference signal 4 is applied to a circuit under test 2. One output reference signal 6a is provided and two other output signals 6b and 6c. This is as described earlier. It should be appreciated that more or less inputs and outputs may be provided than shown in FIG. 1.

The signals provided at the various inputs and outputs are shown in FIGS. 3a to 3d. FIG. 3a shows the input reference signal 4, FIG. 3b shows the output reference signal 6a whilst FIGS. 3c and 3d show the two other output signals 6b and 6c respectively. The principal used in embodiments of the present invention is to keep the output reference signal stationary. Effectively, this means that the dependent output signals 6b and 6c are also stationary with respect to the output reference signal 6a. Instead, the input reference signal is moved according to a fixed delay. In practice, this has proved unexpectedly to be a significantly more efficient technique for referencing. In one use of an embodiment of the present invention, the number of updates required was reduced by around 95%. This had a significant impact on the test time.

A dummy reference value 'a' is selected and represents the time from an arbitrary starting point to a relevant clock edge of the output reference signal 6a. The value of 'a' is selected using trial and error. It is in some embodiments of such a value so that the reference in edge is never negative. In other words, the reference in edge of the input reference signal 4 does not occur prior to the commencement of the point from which the value a is measured. However, this is a restraint only of some testers and in alternative embodiments of the present invention, the reference in edge of the reference in signal 4 may be negative. The variable 'a' is used throughout the testing of the circuit and is independent of the actual conditions. It is usually selected to be greater than the maximum expected delay introduced by the circuit under test between the input reference signal 4 and the output reference signal 6a. It may be possible in some embodiments of the present invention to use the same value of 'a' for more than one circuit.

The equations for the output reference signal 6a can now be defined as a-xns and a+xns. As a remains constant, the equation for the output reference signal does not need to be changed for different voltages etc.

Embodiments of the present invention may thus provide the following advantages.

Embodiments of the present invention make it easier to see and resolve violations in the defined equations for each pin. These types of violations need to be resolved. Real violations that would become apparent in the actual tester hardware, such as time values for certain events being outside permitted parameters, are easier to see and resolve. The improved violation characteristics of embodiments of the present invention are a direct result of the reduced number of equations that reduces the problem space to a more manageable size.

Embodiments of the present invention have the advantage of simplicity. In particular, there is less chance of an error particularly when doing the same sort of calculations for all pins in a large number of wave sets for example 90 or more.

In embodiments of the present invention, the calculations can be taken straight from a data book with the exception of the delay value. The delay value can easily be taken into account in the calculations in an automated system.

In embodiments of the present invention, less guard banding is required.

Updating can be done much more quickly.

In embodiments of the present invention, only updates on one pin, that is the input pin, are needed. However, in alternative embodiments of the present invention, updates may be performed on more than one input pin.

As mentioned above, equations can be taken straight from a data book, which may be in the form of a database. This makes the implementation of embodiments of the present invention simple. As all edges remain stationary except for the reference in edge, timing violations will not appear as the device characteristics change. Once the timing violation has been resolved it will remain resolved. The only exception is the reference in pin. However, as it is only one pin that needs to be considered, it is a relatively simple task to remove violations.

Reference is now made to FIG. 4, which shows how embodiments of the present invention can be used where there is more than one output reference edge. In embodiments of the present invention, when different parameters are referenced to multiple output reference edges, a single delay value can be used. In other words, the same value of a can be used. Previously, with multiple output reference edges, two different delay values were required. This complicates immensely the updating of the various equations. By using a common value for the delay for both output reference signals, the mark space ratio of the input reference needs only to be changed.

Consider the input reference 4 shown in FIG. 4a. The first output reference 6a is defined with respect to a first clock edge 20 of the input reference signal 4. In the same way as described in relation to FIG. 3, the delay value a is defined from an arbitrary starting point. The second output reference signal 6b is defined with respect to a second clock edge 22 of the input reference signal 4. Again, the same value of a can be used with the second output reference signal 6b shown in FIG. 4c.

Embodiments of the present invention are such that only the input reference signal would need to be updated. Thus, even embodiments of the invention that have two or more output reference signals do not add to the complication of the testing process.

Reference will now be made to FIGS. 5a and 5b. Embodiments of the present invention permit pulse width to be simply referenced. Pulse width is defined as a data sheet event specified on the same signal as the reference edge. Another way of defining a pulse width is an event that occurs after the occurrence of a reference edge of the input signal. The event may occur N clock cycles after the reference edge is at the input reference. FIG. 5a shows the input reference signal 4a. The relevant reference edge is referenced 24. The relevant event is referenced 26 in the signal of FIG. 5b, which shows an output signal, for example the output signal 6b. In the embodiment shown, the reference clock of the input signal has a period of 100 ns. This is purely by way of example. Accordingly, half the clock cycle T is 50 ns.

The output pulse can be represented in two different ways. The first way is as follows: The output pulse width is high after minimum 195 ns and maximum 205 ns. This means that the signal will be high at the earliest 195 ns after the reference clock and at the latest 205 ns after the reference clock edge 24.

Alternatively, the output signal can be defined as signal high after minimum 40−5 ns and maximum 40+5 ns where T is half a clock cycle. The reference edge 24 takes place in reality at the beginning of cycle 1. Thus, for test purposes the test will be carried out in a test vector 1T+4T=5T in this case. The equations used to test the pulse width in the test cycle 5, in embodiments of the present invention, will be a +−5 ns for the minimum case and a +5 ns for the maximum case.

Both of these equations may include a factor for guard bands. The factor for the guard bands is added to the other values. The equation for the rising edge of the input reference clock in cycle 5 is defined by a-ref1 (clock edge 24). The equation from the rising edge of the reference clock, that is edge 24 in cycle 1 is not important in embodiments of the present invention.

Reference is now made to FIG. 6, which explains the concept of guard bands. Typically, a change in state of an output signal is defined as occurring at least by a certain time and at the latest by another time. These times are the minimum and maximum times. To take into account tolerances, the signal is considered at a time G before the minimum time. This represents the guard value and takes into account tolerances of the system and the tester. Likewise, the maximum value is considered at a time max+G where G is again the guard value. The equations that are defined for each pin will include guard values.

A look up table will now be described which allows easy translation of data sheets to calculation specifications for use in a test embodying the present invention. The table is shown below.

|  |  | Parameter limits | | | | | |
|---|---|---|---|---|---|---|---|
|  |  | Minimum | | | Maximum | | |
|  |  | ref +/− | +/− gb | Test data | ref +/− | +/− gb | Test data |
| Input | After | + | − | $B_C$ | + | + | $B_C$ |
|  | Before | − | − | $B_T$ | − | + | $B_T$ |
| Output | After | + | + | A | + | − | B |
|  | Before | − | + | B | − | − | A |

This table is arranged to construct a test to check for an invent transition on a pin from a first state, state A to a second state, state B. In addition to the actual state of the test data, information is also supplied to certain cases as to whether the data is true test data (noted by the subscript $_T$) or whether the data is the compliment data (noted by the subscript $_C$) The drive data is always state B. It is possible to remove state B from the table but it is retained for clarity. A general format of the following is assumed: ref +/−(acp +/−guard bands). Acp is an ac parameter, ref is the reference edge and guard bands are the guard bands. The reference will in fact be the value 'a' as described hereinbefore.

Examples of acp parameters can include data hold after read, data set up before read or any other memory strobe before start of a read.

A represents the parameter data hold after read with a minimum of zero and no maximum. B represents data set up before read with a minimum of 25 and no maximum. C represents any memory strobe before start of read with the minimum of −4 and a maximum of +4. In the above parameters "read" forms the reference edge. Data is an input and a memory strobe is an output. Using table 1, the following equations are obtained:

$$\text{At } (a+(A-\text{guard bands})), \text{drive data } B_C \text{ for the input.} \quad [1]$$

This means at a time defined by the delay, the ac parameter and the guard band, the test data is $B_C$. The ac parameter is data hold after read. The test data is applied to the input. The table defines if the reference is to be added or subtracted. Likewise the table defines if the guard band is to be added or subtracted and the value of the test data. As the parameter is data hold after read and data is an input, the data is taken from the after row of the input of the table. As the ac parameter in question does not have a defined maximum, the minimum section of the table is used.

Similarly, the other equations can be defined using the table that defines, depending on the function concerned if the delay and guard bands are to be added or subtracted and what the test data should be.

For the data setup before read parameter, the following equation is defined using the before row of the input and the minimum columns of the table.

$$\text{At } (a-(B-\text{guard bands})), \text{drive data } B_T \text{ for the input.} \quad [2]$$

Consider the data setup before read function. The data required on the data bus is the true data. By way of example, the data will have a non-return to zero (NRZ) format for the data and the test is being carried out over two tester cycles. The first cycle would apply the true data and the indicated time defined by equation [1] and the second cycle would apply the complemented data at the indicated time defined by the equation [2].

For the any other memory strobe before start of read the following equations can be defined for the minimum and maximum cases. For the minimum case, the before row of the output is used with the minimum columns. For the maximum case, the before row of the output is used with the maximum columns.

At $(a-(C+\text{guard bands}))$, expect data $B$ for the minimum case and

At $(a-(C-\text{guard bands}))$ expect data $A$ for the maximum case.

The table set out hereinbefore provides a simple method of translating before and after parameters simply into the correct form of equation.

One problem with using a data sheet as the source for AC tests is the way that unstructured English statements can introduce difficulties in translating those statements into the correct equations. The table described above provides one method of achieving this translation.

In embodiments of the present invention, a set of database rules is defined. These rules can be summarised as follows:

Logical operators are only used. Accordingly + means after a reference and − means before a reference.

The reference transition type is described as being 0 to 1 or 1 to 0.

The specifications transition type is also specified as, for example valid-tristate, 0–1 etc.

The mode of operation of any bi-directional pins is also defined.

For pins in the input mode, it is defined whether the parameter is a set up or hold type of specification.

In order to improve the operation of the database, the number of AC reference edges required should be minimised.

Additionally, to improve the operation of the database, the parameters should not be described in terms of pulse widths but rather as a variation from a reference in the same clock cycle. This is as described before.

Reference will now be made to FIG. 2, which shows a table that permits the writing of equations for pins directly from a centralised logical design database. The test column data is seen as an aid to correct pattern selection and can permit the database to be used for automatic pattern editing. States A and B can be any valid pin mode, for example mid band, valid, 1, 0 etc.

|  |  | Parameter Limits | | | | | |
|---|---|---|---|---|---|---|---|
|  |  | Minimum | | | Maximum | | |
|  |  | Ref +/− | +/− gb | Test data | ref +/− | +/− gb | Test data |
| Input pin | setup | + | + | $B_T$ | + | − | $B_T$ |
|  | hold |  | − | $B_C$ |  | + | $B_C$ |
| Output pin |  |  | + | A |  | − | B |

In order to provide consistency, common naming and syntax should be used.

The tester and specification period values are adjusted to compensate for differences in the test speed versus the data sheet.

Reference will now be made to FIG. 7, which shows a schematic block diagram illustrating the method of testing according to embodiments of the present invention. Although preferred embodiments of the present invention are realised only by software and are described accordingly herein, it will be appreciated that hardware arrangements having equivalent functionality may be used.

A software engine 100 is arranged to perform a program, which in embodiments of the present invention may be a C program. However, in alternative embodiments of the present invention, the software engine 100 may carry out any other form of program. The software engine 100 receives a first input 102 from a first memory location 104. The first memory location 104 is arranged to store the data sheet and/or database described hereinbefore.

The software engine 100 is also arranged to receive as a second input 106 a test pattern 108 that comprises the complete set of inputs and inputs that describe the model to be tested. The test pattern 108 may be generated in any manner known the person skilled in the art. For example, a combined hardware and software model of the device to be tested may be provided with inputs generated by a test bench. The outputs produced by the model are recorded together with the inputs applied in a file. It is this file that is the test pattern that is input to the software engine 100. Alternatively, a purely software model of the device may be used and the file of inputs and outputs recorded in a similar manner. The model of the device to be tested that is used to produce the set of outputs for a given set of inputs does not have to accurately replicate the final timing of the device as long as it produces the expected outputs for a given set of inputs.

Using the two inputs, the software engine 100 is able to provide 3 outputs. The first output comprises the AC test patterns 120. The AC test patterns are the equations described previously. The software engine 100 also provides equation support 122 that provides information on the structure used in the equations output by the AC test patterns.

The software engine also provides an untested fault list 124 which sets out errors that are apparent from the processing carried out by the software engine 100.

The equation support 122 provides an output to a translator 126 as does the AC test patterns 120. The translator 126 takes this information and provides two outputs. The first output is the AC test vectors 128. These test vectors 128 can be displayed or stored and are in a format which can be understood by the tester, for example in any accepted standard format known to those skilled in the art. This may be an automated tester or a human tester.

The translator also provides AC calculation sheets and spec sheets 130. This again is derived from the information provided by the AC test pattern and equation support and is as described earlier.

Figure 8:
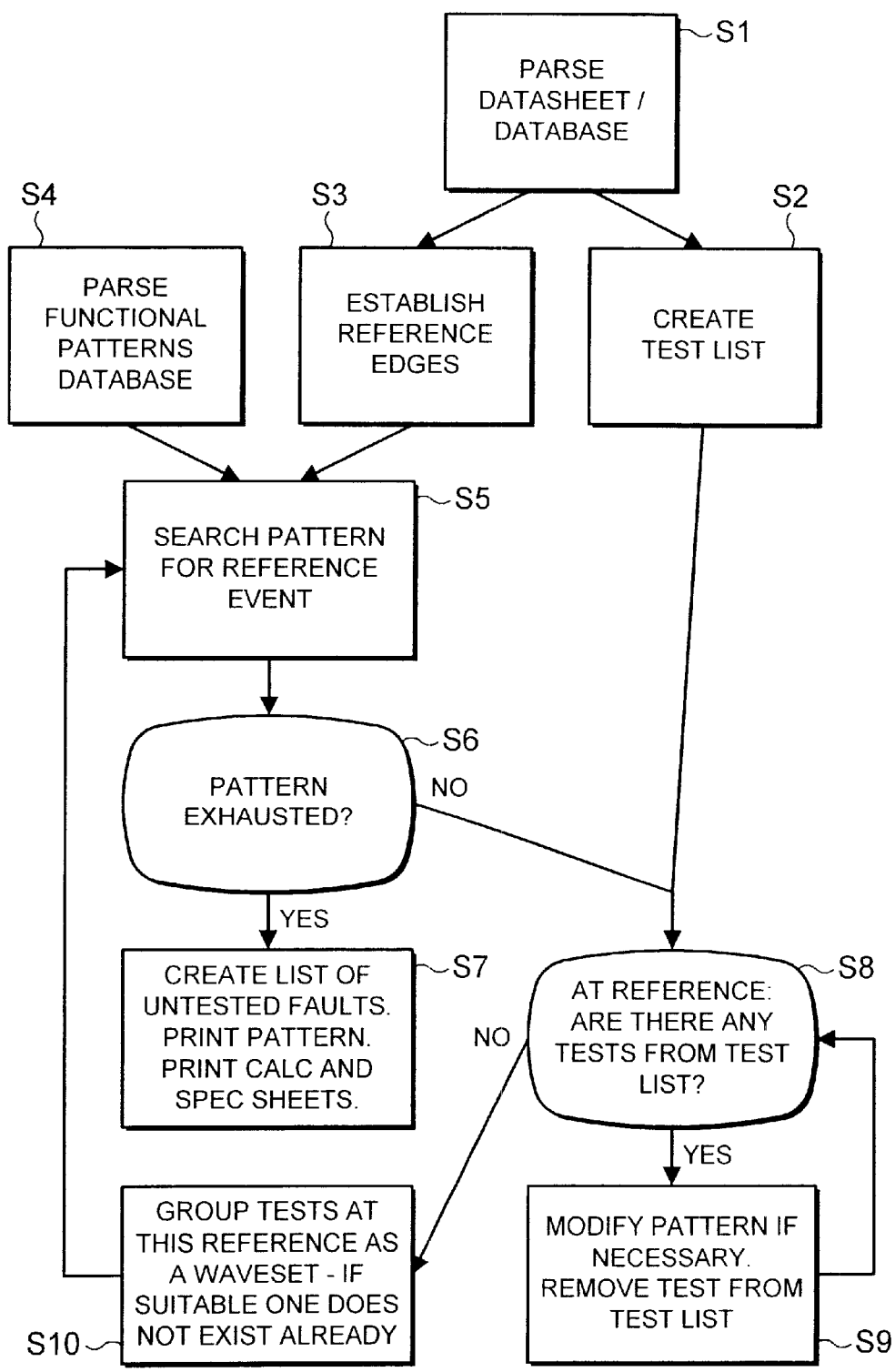
FIG. 8 shows a flow diagram of a method embodying the present invention.

Reference is made to FIG. 8, which shows a flow of the steps carried out by the C program in the software engine 100. In step S1, the software engine 100 parses the data sheet and the AC test patterns. Using the results of the parsing, a test list is created in step S2 comprising a data sheet expansion of buses and transitions. In step S3 the software engine 100 establishes the reference edges. Steps S2 and S3 may take place at the same time.

The software engine also carries out in step S4 a parsing function of the test patterns 108 generated by the device model. Step S4 can take place at the same time as step S2 and S3 or at a different time. Using the results of step S3 and step S4, step S5 is performed in which the pattern is searched for the reference event.

In step S6, the software engine checks to see if the pattern has been exhausted. If it has, step S7 is carried out in which a list of untested faults is created. The test patterns, calculation sheets and specification sheets can be printed or output to the equation support 122 and test patterns 120 respectively. If the patterns have not all been checked, the next step is step S8 that uses the test list.from step S2. If there is a reference, it is checked to see whether or not any tests from the test list need to be checked. In other words, if a test needs to be carried out at a particular time, that test will be carried out. In step S9, any modification to the pattern is carried out and the test, once performed is removed from the test list. This will be continued until all of the tests from the test lists have been completed.

Once the tests from the test lists are completed, the next step is step S10. This step groups together tests at a particular reference as a wave set if a suitable one does not exist already. The next step will then be step S5 again.

In this way, embodiments of the present invention are able to achieve a much quicker method of testing which is capable of an increased if not complete degree of automation.

The circuit under test may be any suitable circuit but in preferred embodiments of the present invention is an integrated circuit. The inputs and outputs of the circuit are thus the input and output pins.

Having thus described at least one illustrative embodiment of the invention, various modifications and improvements will readily occur to those skilled in the art and are intended to be within the scope of the invention. Accordingly, the Foregoing description is by way of example only and is not intended as limiting. The invention is limited only as defined in the following claims and the equivalents thereto.

What is claimed is:

1. A method of testing a circuit comprising the steps of:
   applying at least one input reference signal to a circuit under test;
   providing a reference signal from at least one output of said circuit under test; and
   defining at least one output signal of said circuit with reference to said reference output signal, wherein the timing of said output reference signal is defined independently of said input reference signal.

2. A method as claimed in claim 1, wherein said timing is defined by a reference value.

3. A method as claimed in claim 2, wherein said reference value is selected so that the reference in edge is not negative with respect to the reference out value.

4. A method as claimed in claim 2, wherein said reference value is selected to have a value greater than the maximum time taken for the input reference signal to propagate through the circuit under test.

5. A method as claimed in claim 2, wherein equations are used to define each output.

6. A method as claimed in claim 5, wherein said equations take a form of:

$$a +/- \text{guard band} +/- \text{function}$$

where $a$ is the reference value, the guard band is the guard band and the function is a parameter of the operation being performed.

7. A method as claimed in claim 2, wherein a given output is arranged to occur a given number of cycles after an event in a reference signal.

8. A method as claimed in claim 7, wherein said output is defined with respect to said reference value.

9. A method as claimed in claim 7, wherein the given output is defined with respect to the occurrence of the same event in a coincident cycle of said reference signal.

10. A method as claimed in claim 7 wherein said event is a clock edge.

11. A method as claimed in claim 1, wherein a look up table is provided to translate datasheets into a form which can generate test data.

12. A method as claimed in claim 11, wherein said datasheets are translated into calculation and or specification sheet.

13. A method as claimed in claim 11, wherein said look up table is arranged to indicate the required test data.

14. A method as claimed in claim 11, wherein said look up table is arranged to indicate whether a guard band is to be added to or subtracted from the timing.

15. A method as claimed in claim 11, wherein said look up table is arranged to indicate whether the reference value is to be added to or subtracted from the timing.

16. A method as claimed in claim 2, wherein a plurality of output reference signals are provided and said plurality of output reference signals use the same reference value.

17. A method as claimed in claim 1, wherein the input reference signal is moved relative to the output reference signal.

* * * * *